(12) United States Patent
Alam et al.

(10) Patent No.: US 7,312,487 B2
(45) Date of Patent: Dec. 25, 2007

(54) THREE DIMENSIONAL INTEGRATED CIRCUIT

(75) Inventors: Syed M. Alam, Cambridge, MA (US); Ibrahim M. Elfadel, Ossining, NY (US); Kathryn W. Guarini, Yorktown Heights, NY (US); Meikei Ieong, Wappingers Falls, NY (US); Prabhakar N. Kudva, New York, NY (US); David S. Kung, Chappaqua, NY (US); Mark A. Lavin, Katonah, NY (US); Arifur Rahman, Freemont, CA (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 10/919,121

(22) Filed: Aug. 16, 2004

(65) Prior Publication Data

US 2006/0033110 A1 Feb. 16, 2006

(51) Int. Cl.
*H01L 29/80* (2006.01)
(52) U.S. Cl. .............................. 257/278; 257/E27.026; 257/E21.614; 438/455
(58) Field of Classification Search ................ 257/74, 257/278, 773, 209, E27.026, E21.614, E21.677, 257/E23.01, E23.011, E23.145; 326/41; 438/455, 458
See application file for complete search history.

(56) References Cited

U.S. PATENT DOCUMENTS

| | | | | |
|---|---|---|---|---|
| 4,442,507 A | * | 4/1984 | Roesner | ....................... 365/100 |
| 4,612,083 A | * | 9/1986 | Yasumoto et al. | ............ 438/59 |
| 5,341,345 A | * | 8/1994 | Warner et al. | ................. 367/99 |
| 5,368,942 A | * | 11/1994 | Smith et al. | ................. 428/420 |
| 5,915,167 A | * | 6/1999 | Leedy | .......................... 438/108 |
| 6,093,623 A | * | 7/2000 | Forbes | ........................ 438/455 |
| 6,590,423 B1 | * | 7/2003 | Wong | ........................... 326/93 |
| 6,600,173 B2 | * | 7/2003 | Tiwari | .......................... 257/74 |
| 6,639,821 B2 | * | 10/2003 | Battersby | ...................... 365/63 |
| 6,846,703 B2 | * | 1/2005 | Shimoda et al. | ............. 438/109 |
| 6,983,443 B2 | * | 1/2006 | Korzyniowski et al. | ....... 716/18 |
| 2002/0179957 A1 | | 12/2002 | Traylor et al. | ............... 257/312 |
| 2003/0020090 A1 | | 1/2003 | Heck et al. | .................. 257/146 |
| 2004/0017242 A1 | * | 1/2004 | Lee | .............................. 327/293 |

OTHER PUBLICATIONS

Kioi et al. (Design and Implementation of a 3D-LSI Image Sensing Processor, IEEE Journal of Solid-State Circuits vol. 27, No. 8, Aug. 1992, pp. 1130-1140).*

Kunio et al., Three Dimensional ICs, Having Four Stacked Active Layers, IEDM 89-837, Jul. 1, 1989, pp. 34.6.1-4, Publisher: IEEE, Published in: US.

* cited by examiner

*Primary Examiner*—Kenneth Parker
*Assistant Examiner*—William F. Kraig
(74) *Attorney, Agent, or Firm*—Law Office of Charles W. Peterson, Jr.; Louis J. Percello, Esq.; Rafael Perez-Piniero, Esq.

(57) ABSTRACT

A three dimensional (3D) integrated circuit (IC), 3D IC chip and method of fabricating a 3D IC chip. The chip includes multiple layers of circuits, e.g., silicon insulator (SOI) CMOS IC layers, each including circuit elements. The layers may be formed in parallel and one layer attached to another to form a laminated 3D chip.

11 Claims, 4 Drawing Sheets

THREE DIMENSIONAL INTEGRATED CIRCUIT

BACKGROUND OF THE INVENTION

1. Field of the Invention

The present invention is related to integrated circuit (IC) design and, more particularly, to designing and fabricating ICs in three dimensions (3D).

2. Background Description

Semiconductor technology and chip manufacturing advances have resulted in a steady decrease of chip feature size to increase on-chip circuit switching frequency (circuit performance) and the number of transistors (circuit density). Generally, all other factors being constant, the active power consumed by a given unit increases linearly with switching frequency. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, reducing net power consumption is important but, such a power reduction must come without degrading chip/circuit performance below acceptable levels.

To minimize semiconductor circuit power consumption, most integrated circuits (ICs) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (modeled simply as a closed switch), the other device (the PFET) is off, not conducting (ideally modeled as an open switch) and, vice versa. A CMOS inverter, for example, is a PFET and NFET pair that are series connected between a power supply voltage ($V_{dd}$) and ground (GND). Both are gated by the same input and both drive the same output, typically a capacitive load and, ideally, a typical CMOS circuit consumes only transient or switching power.

The typical approach to improving density (more FETs per unit area) has been to shrink minimum design dimensions. However, this approach is always limited by those minimum dimensions. For added density chips can be stacked to double, triple and etc. device density in what may be termed a three dimensional (3D) chip. However, simply stacking chips requires maintaining the normal chip circuit boundaries. So signals passing between chip boundaries still suffer the penalties attributed to inter-chip communications. By contrast, in what may be termed a rudimentary top down approach, layers of FETs, e.g., alternating layers of PFETs and NFETs, are formed individually and bonded on top of one another to form a 3D IC chip. For example, Kunio et al., entitled "Three Dimensional ICs, Having Four Stacked Active Device Layers," IEEE, 1989, describes forming such a top down CMOS chip with polysilicon interconnects connecting the FETs on adjacent layers into circuits. In this example, a CMOS static random access memory (SRAM), programmable logic array (PLA), and CMOS gate array for I/O buffers are included on the same 3D IC chip. Polysilicon has inherent resistance that may be ignored for short distances, e.g., cross coupling SRAM cell inverters, but adds delay when driving a load of any significance (i.e., the polysilicon connection resistance from a driver driving a large capacitive load combines to add an RC delay to the path) and long polysilicon wire runs act as a distributed RC which also adds a distributed delay.

In state of the art top down 3D chips, however, individual circuits/macros are assembled or placed on one or more various circuit layers. Each of the circuit layers may include local wiring to wire devices together into circuits (e.g., AND, OR, NAND, NOR gates) and, in some cases, to wire circuits together into higher order functions (e.g., an n bit by n bit multiplier) or macros. The circuit layers are joined to form a single multilayered 3D chip. However, if the circuit layers are improperly or imprecisely aligned, chip functions may fail. Further, wiring on one layer can interfere electrically with wiring on another, e.g., through cross talk or because a signal cannot be routed between layers. So, typically, strict wiring constraints are necessary to avoid wiring problems and to adequately allocate wiring resources between the circuit layers. Furthermore, structures and systems must, of necessity, optimize wiring resources. Optimal logic and memory structure partitioning and placement is not well understood for these types of top down layered chips. Further, as noted above, timing problems can arise during logic partitioning for stacked macros. So, it may be impossible after placement and partitioning to close on the design, e.g., from the point of view of timing, thermal issues and/or noise. Finally, designing random logic in multiple layers can be very expensive, requiring special tools and much more complex simulations.

In what is sometimes termed a bottom up approach, after the design for one layer of circuits is completed with macro/layer inputs and outputs (I/Os) set, the design for the next layer begins. So, for example, circuits are fabricated conventionally on the lowest layer, e.g., on bulk silicon substrate or a silicon surface layer of a silicon on insulator (SOI) wafer. Then, a second circuit layer is formed (e.g., epitaxial silicon (epi Si) growth, recrystallization of amorphous silicon, or wafer bonding) on the base wafer and device processing is completed on that second layer. Thereafter, the sequence may be repeated to create additional superstructure circuit layers. Generally, once place and wire is complete for a circuit layer subsequent design considerations (e.g., selectively powering up logic gates as a result of timing analysis), the layer may, necessarily, be re-placed and re-wired if insufficient space remains, e.g., for powering up buffers. Furthermore, FETs formed in upper layers of bottom up 3D chips are of poor quality and degrade circuit performance. In addition, because forming the upper layers thermally cycles previously formed lower layers, sequentially forming subsequent circuit layers also degrades characteristics of the bottom, base circuit layer. For example, thermal cycling can cause dopant to diffuse from a well defined source/drain into adjacent channel regions, which degrades performance even for those circuits that do not include devices in layers other than the base circuit layer. As a result, material choices are limited for bottom up designs and, although very high density chips may be formed, FET quality is incompatible with high performance.

Thus, there is a need for very dense high performance integrated circuits and a method of designing such circuits such that circuit function may be distributed amongst a number of circuit layers without adversely impacting circuit performance.

SUMMARY OF THE INVENTION

It is a purpose of the invention to improve integrated circuit (IC) chip density;

It is another purpose of the invention to simplify IC design;

It is yet another purpose of the invention to increase IC chip functionality;

It is yet another purpose of the invention to increase IC chip functionality and improve IC chip density without complicating IC chip design and without impairing chip performance.

The present invention relates to a three dimensional (3D) integrated circuit (IC), 3D IC chip and method of fabricating a 3D IC chip. The chip includes multiple layers of circuits, e.g., silicon insulator (SOI) CMOS IC layers, each including circuit elements. The layers may be formed in parallel and one layer attached to another to form a laminated 3D chip. The present invention also relates to a 3D chip design methodology that makes optimal use of the presence of more than one layer of active devices.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
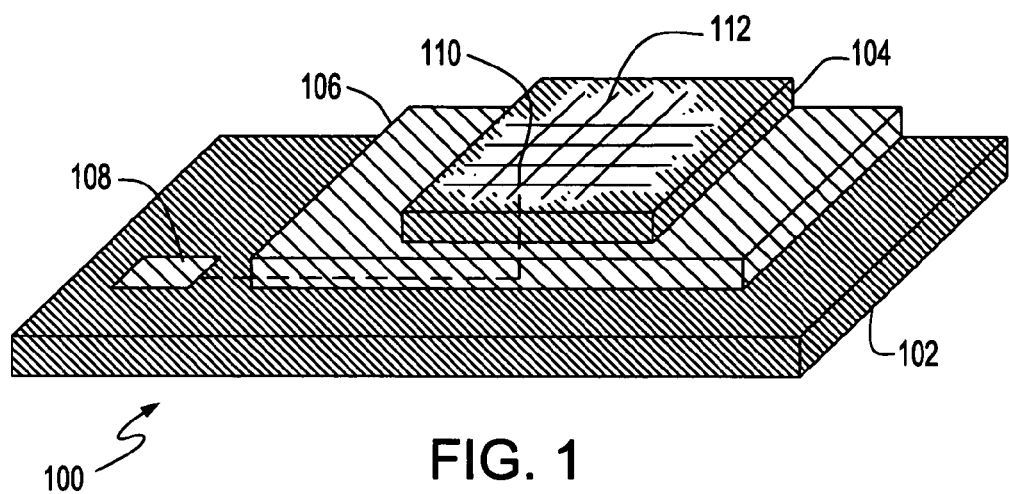
FIG. 1 shows an example of a preferred embodiment three dimensional (3D) integrated circuit (IC) chip formed according to the present invention.

Turning now to the drawings and, more particularly, FIG. 1 shows an example of a preferred embodiment three dimensional (3D) integrated circuit (IC) chip 100 formed according to the present invention. In this example, a first layer of circuits 102 supports a second layer of circuits 104, e.g., where the first layer 102 is a synchronous logic or pipeline layer and the second layer 104 includes a clock distribution (clock tree) for the first layer 102. It should be noted that as referred to herein a layer of circuits is a device structure or circuit wherein complete individual active and/or passive devices are contained and, further, may be wired together. Thus, circuits in a layer of circuits may include capacitors, such as decoupling capacitors, inductors, resistors and etc. In this example, the layers of circuits 102, 104 are connected together by an optional third layer of circuits 106 sandwiched therebetween, which is a layer of wires in this example. Circuit elements 108, e.g., a field effect transistor (FET), logic gate, macro or any suitable circuit element or electrical device, on the first layer 102 connect through the wiring layer 106 to circuit elements 110 in the second layer of circuits 104, which may be an array of circuit elements, e.g. a driver in a driver grid 112. Although each succeeding layer 106, 104 shown in this example is smaller (less surface area) than its underlying layer 102, 106, this is for example only. Typically, all layers 102, 106, 104 are coextensive covering the same area and forming a chip 100 with a uniform thickness. Furthermore, although the 3D IC chip 100 of this example includes 3 layers of circuits 102, 104, 106 this is selected by design and for example only. Any suitable number of layers of circuits may be selected.

Figure 2A:
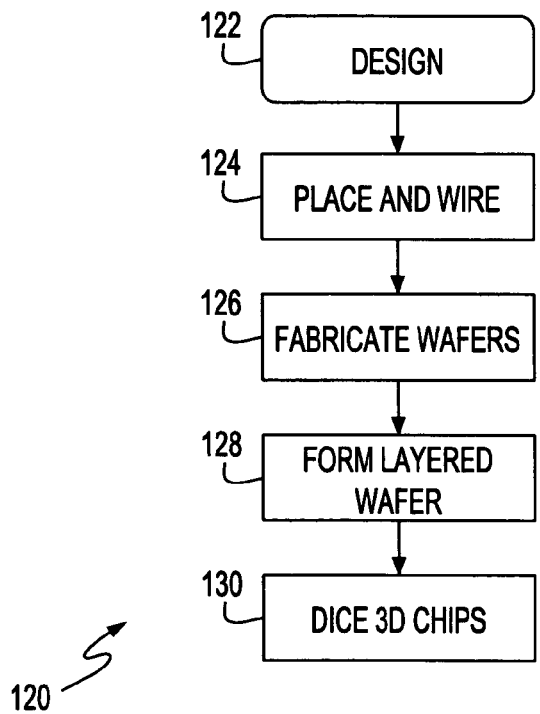
FIGS. 2A-B show an example of steps in forming preferred embodiment 3D chips.

FIG. 2A shows an example 120 of steps in forming a chip, e.g., chip 100, according to a preferred embodiment of the present invention. A logic or circuit design is provided in step 122 and placed and wired in step 124. In particular, during place and wiring step 124, the design may be partitioned to selectively place some functions on one circuit layer or to distribute devices, logic gates, etc. amongst the circuit layers. In step 126 the layer wafers are fabricated in parallel, e.g., with each layer of circuits being on an individual wafer or wafers in a wafer lot. In step 128 the layers of circuits are combined to form a single multilayered 3D circuit, e.g., the layered wafers are laminated together to form a single 3D wafer. The laminated 3D wafer is diced normally in step 130 to separate individual preferred embodiment 3D chips.

Figure 2B:
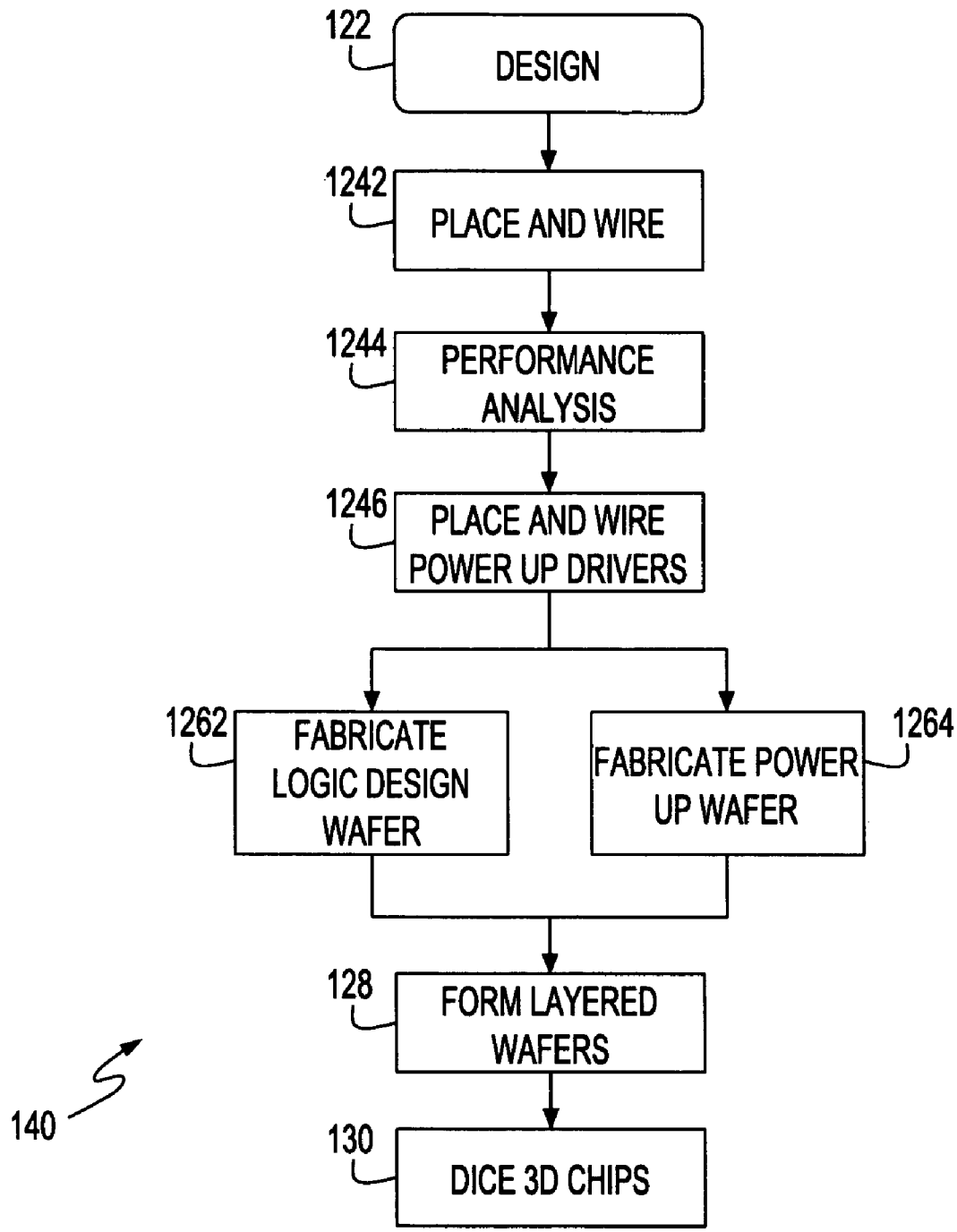

FIG. 2B shows an example 140 of a two (2) circuit layer variation of the example of FIG. 1 with like steps labeled identically. Again in step 122 an initial design, e.g., a logic design for a standard cell logic library, is provided and initially placed and wired in step 1242, preferably, on a single circuit layer. Buffers may be selectively omitted for placement on a subsequent circuit level. The boundaries between the logic and the omitted buffers are considered for the logic placement. Then in this example, the logic (minus buffers) are placed and wired on a single circuit layer. The single circuit layer design is passed for performance analysis in step 1244, e.g., using typical state of the art performance analysis tools. The performance analysis typically identifies logic elements on the first circuit layer that must be powered up or placed close together, e.g., placing a first cell driving (a source) a buffer or an input of a second (a sink) to meet performance requirements. Buffers may be placed with the logic on the first layer if space is available. Otherwise, in step 1246, buffers, power up drivers and etc., are placed on the second layer of circuits. Since buffers and power up drivers are placed on a second layer, buffers and drivers are easily placed close to the circuit it is buffering or powering up, even when no space is available in the vicinity of the particular first layer circuit. Also, optionally, late changes (such as what are known as engineering changes or ECs) to the design of the first layer may be made through the second layer. So, where previously space might not normally be available after the first layer placement, sufficient space is available on a preferred embodiment design at a corresponding overlying location in the second layer, e.g., placed as a stand alone logic element or selected from one or more cells in an array of cells or a driver array.

Once performance analysis is complete in step 1244 and additional logic has been placed and wired on the second circuit layer in step 1246; in steps 1262 and 1264, the layers of circuits are formed on wafers, preferably in parallel, e.g., with each layer being on an individual SOI wafer or wafers in a SOI wafer lot. Typically, the SOI wafers are formed conventionally to final or back end metallization. Step 128 begins, for example, by attaching each of the second layer wafers to a glass handle wafer using polymeric adhesives. Then, the second layer wafers may be thinned, e.g., by grinding and etching the wafer substrate and stopping on the buried oxide (BOX) layer. Each second layer wafer, which is transparent due to the thinning, is aligned and fixed, e.g., glued, to a first circuit layer wafer. Since the second layer wafer is transparent, all layers of circuits may be designed for a particular 3D IC chip with the same, common orientation on the original base substrates (all "face up"), to facilitate straightforward stacking layers of circuits. Thus, each subsequent layer wafer may be aligned to the immediately preceding layer wafer using overlay registration in a manner similar to mask-to-wafer alignment in photolithography. This alignment assures the electrical integrity of the pre-fabricated 3D circuits to facilitate successful high performance 3D ICs. Once attached, connections are formed between the laminated layers, e.g., etching inter-layer through-holes and metalizing to form vias in the through-holes. Finally, the laminated wafer stack is diced normally in step 130 to separate individual preferred embodiment 3D chips and with thermal and mechanical stresses minimized.

For larger designs, where the original design does not fit within a single chip footprint, in step 1242 the logic is partitioned between the first and second layers of circuits such that a majority of the circuit elements are in the first layer, e.g., 102 in FIG. 1. Then in step 1244 traditional physical synthesis optimizes both layers of circuits of the design for closure. During this performance analysis step 1244 additional circuit elements are identified and, if space is available, placed on the first layer wafer at the appropriate location; otherwise, if sufficient space is unavailable on the first layer of circuits or, if the additional elements cannot be placed without incurring an unacceptable performance penalty, the circuit elements are placed on the second layer of circuits, preferably such that the locations on both layers align, e.g., with an added sink immediately above the source. As noted above, the added element may be selected from elements of an existing regular any on the second layer or, a new circuit element may be created on the second layer.

Figure 3A:
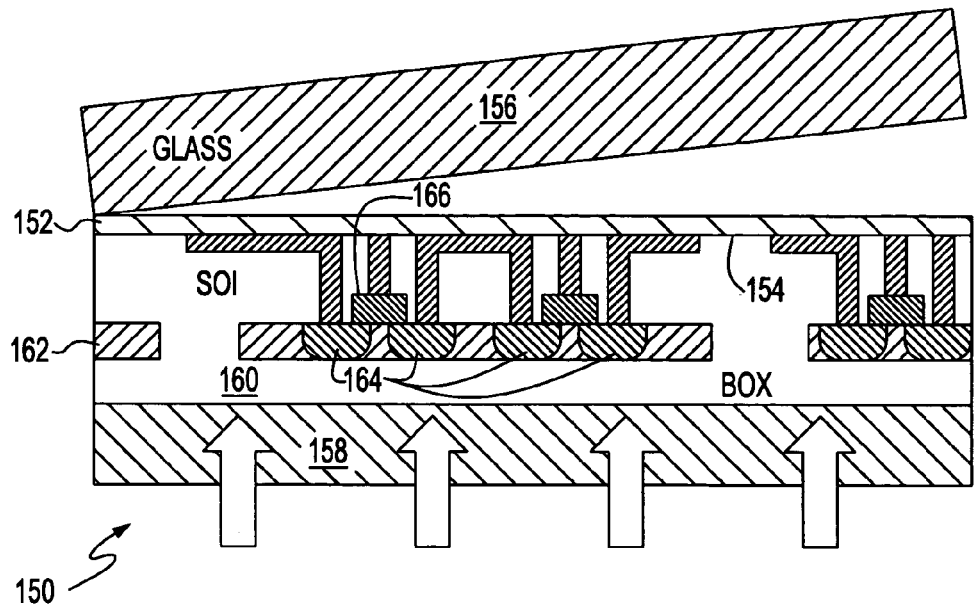
FIGS. 3A-C show an example of the step of attaching wafers in FIGS. 2A-B.
Figure 3B:
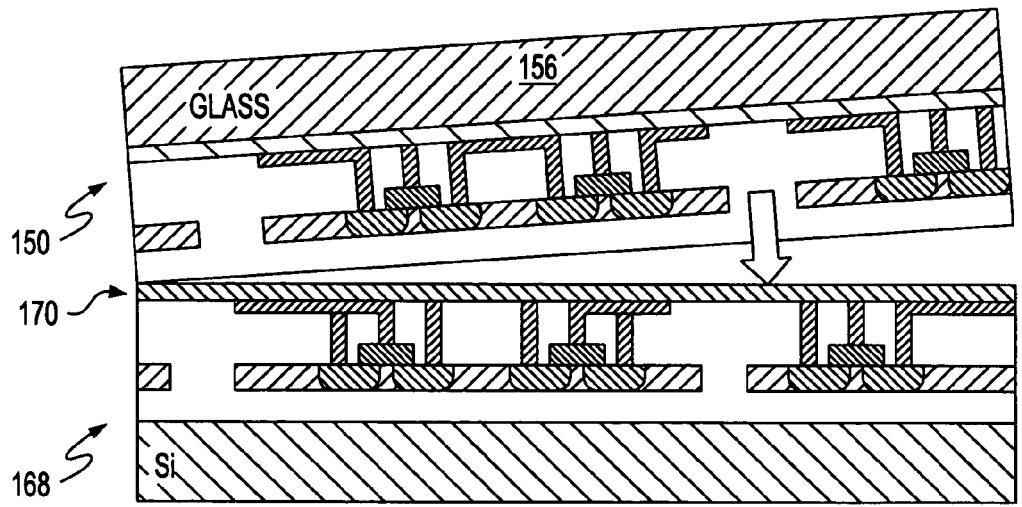
Figure 3C:
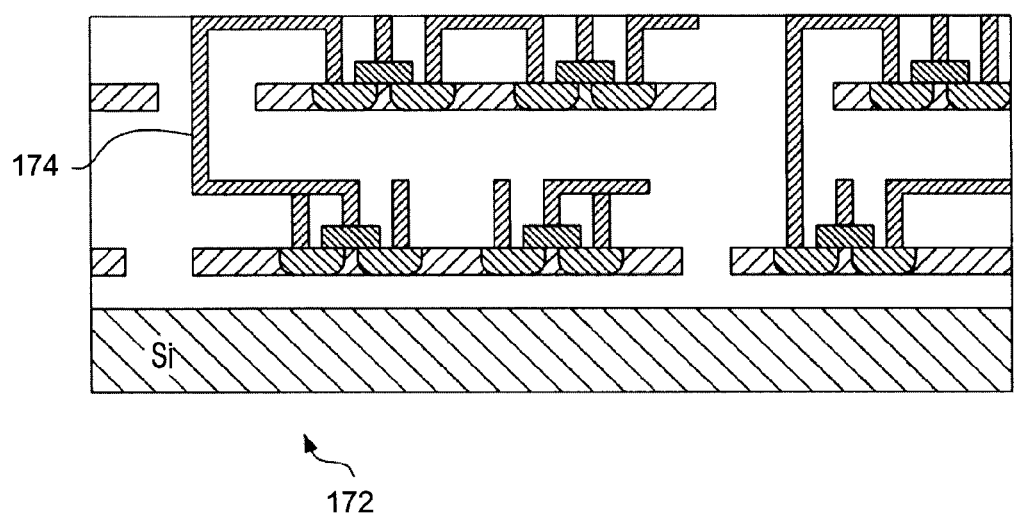

FIGS. 3A-C show an example of the step 128 of attaching wafers in FIGS. 2A-B. FIG. 3A shows the completed second layer wafer 150, e.g., a 200 millimeter (200 mm) SOI wafer with a bonding layer 152 on an upper surface 154 for attaching the glass handle wafer 156. The glass handle wafer 156 gives structural stability to the layer of circuits allowing removal of the original substrate. As with a typical SOI wafer, a substrate layer 158, e.g., silicon, supports an insulator layer 160, e.g., a BOX layer. A silicon device layer 162 has been divided to form device islands with source/drain regions 164 formed in the islands and gates 166 between the source/drain regions. The bonding layer 152 may be any suitable material for attaching the glass handle layer 156 to the wafer such that it remains attached as the substrate layer 158 is removed. The substrate layer 158 is removed by grinding and etching the wafer substrate layer 158 and stopping on the BOX layer 160. In particular, the thickness of the second layer is less than 50 micrometers (μm) or microns and more particularly, less than 15 μm. Then in FIG. 3B, after attaching the glass handle layer 156 and removing the substrate layer, the second layer wafer 150 is attached to a respective first layer wafer 168, e.g., using polymeric adhesives 170, bonding the layer wafers together. So, the first layer of circuits has been transferred from its original substrate layer 158 to the first layer of circuits 168 with the first layer of circuits 168 acting as a substrate for the second. In FIG. 3C the handle wafer 156 and bonding layer 152 are removed and the 3D circuit wafers 172 are completed vertical by forming interconnects 174 between conductive elements or wires between the laminated layers of circuits. In particular, both the connections on the layer wafers 150, 168 and the interconnections 174 there between may be copper, tungsten or, metalized studs and via.

Advantageously, in the preferred embodiment top-down approach, all of the layers of circuits can be fabricated simultaneously using conventional IC manufacturing techniques. Circuit elements on individual circuit layers combine to form higher level circuit elements, whether as adding power up buffers to otherwise underpowered logic circuits or as connecting I/O drivers to a macro, completing the macro I/O boundary. Each individual layer of circuits can be tested, e.g., at step 126 in FIG. 2A, prior to assembling the 3D IC. This facilitates acceptable chip yield and lowers manufacturing costs over putting off functional testing until the full 3D IC is complete. Transistor packing density is improved by a reduced chip footprint that is possible because of the third circuit dimension. This is particularly appealing for military and for wireless or portable electronics that place a premium on silicon real estate.

Additionally, circuit performance is enhanced for preferred embodiment 3D ICs because, instead of long wire runs between circuits, short vertical runs between layers of circuits reduce average interconnect length as compared to typical single layer chips. Wire length related performance latency, which may severely restrict performance as feature sizes are scaled down, is mitigated by the reduced electrical distance. This results in improved communication, e.g., between memory on one layer and a microprocessor on another, providing a significant performance gain for some applications. In particular, in synchronous chips with deep pipelines, the lengths of clock runs is dramatically reduced, e.g., by stacking clocked stages in a relatively small horizontal area, which increases the fraction of chip area accessible in a single clock cycle for a much greater logical span of control than would be possible with the same logic function spread out on a single layer of circuits. In addition, deep pipelines that perform speculative execution require high fan-out from a given data source. Since, fan-out for a typical FET circuit is limited to a fixed amount of capacitive gain per cycle, this limit is increased because extrinsic load (such as wiring) is reduced.

Furthermore, noise, such as cross talk from long runs (that are relatively large capacitive signal loads) of parallel signal or clock lines, as well as power is dramatically reduced by shorter wire lengths and die size. Similarly, noise immunity at each input gate is improved and fewer repeaters, e.g., for clocks, are necessary since there are fewer global wires that are much shorter than might be for the equivalent horizontal circuit function. In yet another advantage, mixing otherwise typically incompatible technologies provides a rich selection of single chip functions. Hybrid circuits are formed by stacking layers of circuits in a single preferred embodiment 3D chip, e.g., providing CMOS logic on one layer of circuits with one or more other layer that includes photonic/electronic circuits, memory, analog and/or radio frequency (RF) circuits. Thus, heterogeneous materials, devices, and signals can be integrated with SOI CMOS circuits without performance sapping off chip and/or off module connections and for much more flexibility in circuit and device structure, system design, and routing.

While the invention has been described in terms of preferred embodiments, those skilled in the art will recognize that the invention can be practiced with modification within the spirit and scope of the appended claims.

What is claimed is:

1. An integrated circuit (IC) chip comprising:
   a substrate layer;
   a first insulating layer on said substrate layer;
   a first semiconductor layer on said first insulating layer, transistors being formed from said first semiconductor layer and connected together into circuit elements in a circuit layer;
   a second insulating layer attached to said first semiconductor layer;
   a second semiconductor layer on said second insulating layer, transistors being formed from said second semiconductor layer, and connected together into an array of circuit elements in a circuit layer, wherein a majority of IC chip elements are located on said first semiconductor layer; and a plurality of interlayer connection channels, each interlayer connection channel having an end terminating on and extending from one of said circuit elements on said first semiconductor layer and said second semiconductor layer, ones of said circuit elements on said first semiconductor layer being connected through said plurality of interlayer connection channels to corresponding ones of said circuit elements on said second semiconductor layer, connection of said ones to said corresponding ones forming a three dimensional (3D) higher level circuit element within said IC;

wherein said circuit elements on said SOI CMOS circuit layer include combinational logic and said array of circuit elements is a CMOS driver grid, selected drivers of said CMOS driver grid being power up buffers for corresponding combinational logic gates on said SOI CMOS circuit layer.

2. An IC chip as in claim 1, wherein said first semiconductor layer is a silicon layer and said substrate layer, said first insulating layer and said silicon layer are layers in a silicon on insulator (SOI) CMOS circuit layer.

3. An IC chip as in claim 2, wherein said SOI CMOS circuit layer further comprises a wiring layer above said silicon layer, said transistors being connected together by wiring in said wiring layer and said IC further comprises a polymeric adhesive layer bonding said second insulating layer and said SOI CMOS circuit layer, said polymeric adhesive layer attaching said second semiconductor layer to said SOI CMOS circuit layer, said plurality of interlayer connection channels extending linearly between said ones and said corresponding ones.

4. An IC chip as in claim 2, further comprising a wiring layer disposed between said SOI CMOS circuit layer and said second semiconductor layer, another end of ones of said plurality of interlayer connections being connected to wires on said wiring layer.

5. An IC chip as in claim 4, wherein said second semiconductor layer includes a clock distribution for said SOI CMOS circuit layer.

6. An IC chip as in claim 5, wherein said clock distribution includes a plurality of CMOS clock drivers.

7. An IC as in claim 4, wherein said second insulator layer and said second semiconductor layer are layers in a second SOI CMOS circuit layer.

8. A CMOS integrated circuit (IC) chip comprising:
an SOI circuit layer comprising:
  a semiconductor substrate layer;
  an insulating layer on said substrate layer, and
  a silicon layer on said insulating layer, Field Effect Transistors (FETs) being formed in said silicon layer and connected together into circuit elements in a circuit layer;
a second insulating layer attached to said SOI circuit layer;
a CMOS driver grid in a second silicon layer on said second insulating layer, wherein a majority of IC chip elements are located on said SOI circuit layer; and a plurality of interlayer connection channels, each interlayer connection channel having an end terminating on and extending from one of said circuit elements in said SOI circuit layer and said second silicon layer, ones of said circuit elements on said SOI circuit layer being connected through said plurality of interlayer connection channels to corresponding ones of said array of circuit elements, connection of said ones to said corresponding ones forming a three dimensional (3D) higher level circuit element within said CMOS IC; and wherein said circuit elements on said SOI circuit layer include combinational logic, selected drivers of said CMOS driver grid being power up buffers for corresponding combinational logic gates on said SOI CMOS circuit layer.

9. A CMOS IC chip as in claim 8, wherein said SOI circuit layer further comprises a wiring layer above said silicon layer, said FETs being connected together by wiring in said wiring layer and said IC further comprises a polymeric adhesive layer bonding said second insulating layer and said SOI circuit layer, said polymeric adhesive layer attaching said second silicon layer to said SOI circuit layer, said plurality of interlayer connection channels extending linearly between said ones and said corresponding ones.

10. A CMOS IC chip as in claim 8, further comprising a wiring layer attached between said SOI circuit layer and said second silicon layer, another end of ones of said plurality of interlayer connections being connected to wires on said wiring layer.

11. An integrated circuit (IC) comprising:
a plurality of circuit layers adhesively bonded to one another in a stack and including at least a first circuit layer and a second circuit layer of transistors connected together into circuit elements, wherein said first circuit layer is a silicon on insulator (SOI) CMOS circuit layer, said circuit elements on said SOI CMOS circuit layer comprise combinational logic said second circuit layer includes an array of active circuit elements and said array of active circuit elements is a CMOS driver grid, selected drivers of said driver grid being power up buffers for corresponding combinational logic gates on said SOI CMOS circuit layer;

a plurality of said circuit elements on said second circuit layer being disposed directly above a plurality of said circuit elements on first layer; and a plurality of interlayer connection channels, each interlayer connection channel having an end terminating on one of said circuit elements on said first layer and said second layer, ones of said circuit elements on said first layer being connected through said plurality of interlayer connection channels to corresponding ones of said circuit elements on said second layer, connection of said ones to said corresponding ones forming a three dimensional (3D) higher level circuit element within said IC.

* * * * *